US009502222B2

(12) United States Patent
Ockenfuss

(10) Patent No.: US 9,502,222 B2
(45) Date of Patent: *Nov. 22, 2016

(54) INTEGRATED ANODE AND ACTIVATED REACTIVE GAS SOURCE FOR USE IN MAGNETRON SPUTTERING DEVICE

(75) Inventor: Georg J. Ockenfuss, Santa Rosa, CA (US)

(73) Assignee: VIAVI SOLUTIONS INC., Milpitas, CA (US)

( * ) Notice: Subject to any disclaimer, the term of this patent is extended or adjusted under 35 U.S.C. 154(b) by 810 days.

This patent is subject to a terminal disclaimer.

(21) Appl. No.: 13/244,145

(22) Filed: Sep. 23, 2011

(65) Prior Publication Data

US 2012/0012459 A1    Jan. 19, 2012

Related U.S. Application Data

(63) Continuation-in-part of application No. 13/087,301, filed on Apr. 14, 2011, now Pat. No. 8,480,865.

(Continued)

(51) Int. Cl.
*H01J 37/34*    (2006.01)

(52) U.S. Cl.
CPC ........ *H01J 37/3405* (2013.01); *H01J 37/3423* (2013.01)

(58) Field of Classification Search
CPC ............... H01J 37/3405; H01J 37/3423; C23C 14/505; C23C 14/3457; C23C (Continued)

(56) References Cited

U.S. PATENT DOCUMENTS

| 4,610,774 A | 9/1986 | Sakata et al. ............... 204/298 |
| 4,927,515 A | 5/1990 | Keith ...................... 204/298.21 |

(Continued)

FOREIGN PATENT DOCUMENTS

| EP | 1628324 | 2/2006 | ............ H01J 37/34 |
| EP | 2378538 | 10/2011 | ............ H01J 37/34 |

(Continued)

OTHER PUBLICATIONS

Machine Translation JP 2002-069632 dated Mar. 2002.*

(Continued)

*Primary Examiner* — Rodney McDonald
(74) *Attorney, Agent, or Firm* — Mannava & Kang, P.C.

(57) ABSTRACT

The invention relates to an integrated anode and activated reactive gas source for use in a magnetron sputtering device and a magnetron sputtering device incorporating the same. The integrated anode and activated reactive gas source comprises a vessel having an interior conductive surface, comprising the anode, and an insulated outer body isolated from the chamber walls of the coating chamber. The vessel has a single opening with a circumference smaller that that of the vessel in communication with the coating chamber. Sputtering gas and reactive gas are coupled through an input into the vessel and through the single opening into the coating chamber. A plasma is ignited by the high density of electrons coming from the cathode and returning to the power supply through the anode. A relatively low anode voltage is sufficient to maintain a plasma of activated reactive gas to form stoichiometric dielectric coatings.

13 Claims, 12 Drawing Sheets

Related U.S. Application Data

(60) Provisional application No. 61/472,494, filed on Apr. 6, 2011, provisional application No. 61/325,162, filed on Apr. 16, 2010.

(58) Field of Classification Search
CPC .................. 14/0036;C23C 14/0063; C23C 14/0068; C23C 14/0078
USPC ............ 204/298.14, 298.07, 298.06, 298.23, 204/298.28
See application file for complete search history.

(56) References Cited

U.S. PATENT DOCUMENTS

| | | | |
|---|---|---|---|
| 5,122,252 A * | 6/1992 | Latz et al. | 204/298.26 |
| 5,366,607 A | 11/1994 | Lal et al. | 204/298.19 |
| 5,597,459 A | 1/1997 | Altshuler | 204/192.12 |
| 5,855,745 A * | 1/1999 | Manley | 204/192.12 |
| 6,719,886 B2 | 4/2004 | Drewery et al. | 204/298.18 |
| 7,879,209 B2* | 2/2011 | Tilsch et al. | 204/298.06 |
| 8,163,144 B2* | 4/2012 | Tilsch et al. | 204/298.14 |
| 8,480,865 B2* | 7/2013 | Ockenfuss | 204/298.27 |
| 8,500,973 B2* | 8/2013 | Ockenfuss et al. | 204/298.14 |
| 2004/0118678 A1* | 6/2004 | Hartig | 204/298.07 |
| 2006/0049041 A1 | 3/2006 | Ockenfuss et al. | 204/298.14 |
| 2006/0070877 A1 | 4/2006 | Tilsch et al. | 204/298.27 |
| 2006/0151312 A1 | 7/2006 | Scherer et al. | 204/192.12 |

FOREIGN PATENT DOCUMENTS

| | | | |
|---|---|---|---|
| JP | 2000-226652 A | 8/2000 | |
| JP | 2002-069632 | * 3/2002 | |
| WO | 2007/118204 | 10/2007 | ............ C23C 14/32 |

OTHER PUBLICATIONS

"Advanced Radio Frequency Plasma Enhanced Evaporation and its Advantages" W. Schwärzler, Provac AG, Balzers, Principality of Liechtenstein, $52^{nd}$ Annual Technical Conference Proceedings, Santa Clara (CA) May 9-14, 2009 p. 31-33.

"Measurement and Correlation of Ion Beam Current Density to Moisture Stability of Oxide Film Stacks Fabricated by Cold Cathode Ion Assisted Deposition" Morton et al, Denton Vacuum, LLC, Moorestown, NJ, $41^{st}$ Annual Technical Conference Proceedings (1998) pp. 297-302.

"Low Temperature Optical Coatings with High Packing Density Produced with Plasma Ion-Assisted Deposition" Beißwenger et al., Leybold AG, Germany, $37^{th}$ Annual Technical Conference Proceedings (1994) pp. 21-24.

http://www.ionsource.com/products_gpst.cfm Printed Oct. 25, 2011, Posting date Unknown.

Tilsch et al. "Manufacturing of precision optical coatings". Chinese Optics Letters, vol. 8, No. S1, Jan. 1, 2010 pp. 38-43.

Hendrix et al. "Demonstration of narrowband notch and multi-notch filters" Proceedings of SPIE, vol. 7067, Aug. 28, 2008, pp. 706702-1 to 706702-14.

Search Report for EP Appln No. 11183181 dated Apr. 16, 2014.

* cited by examiner

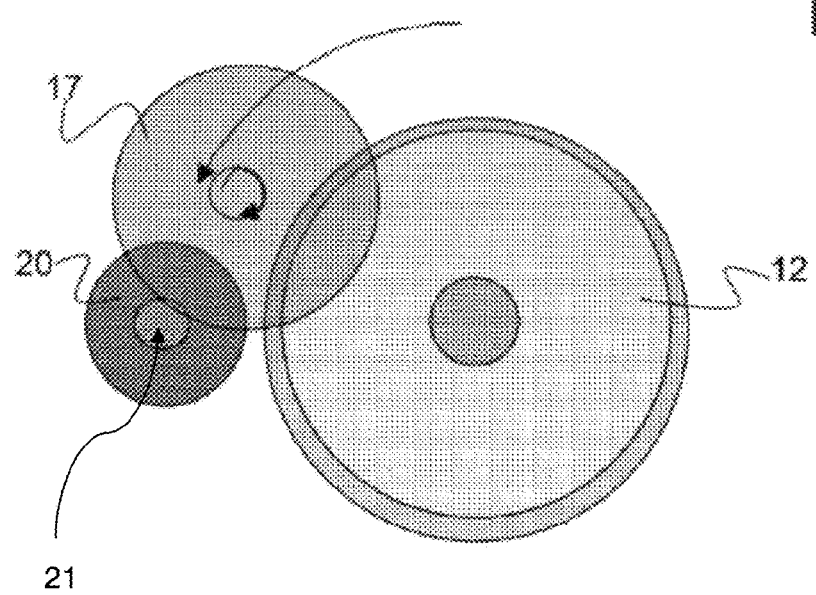

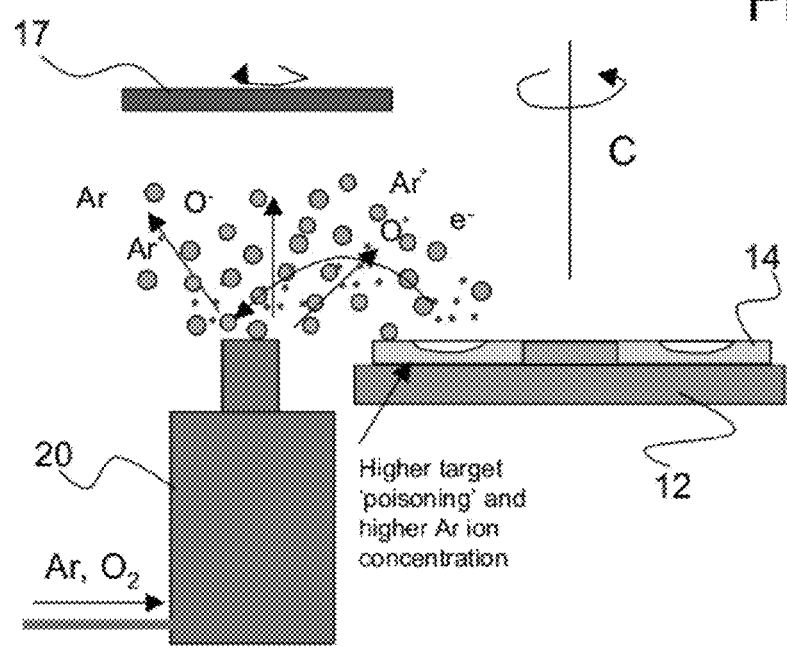

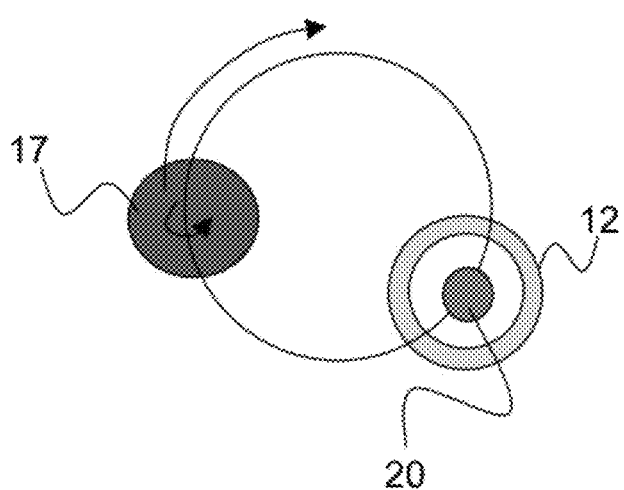

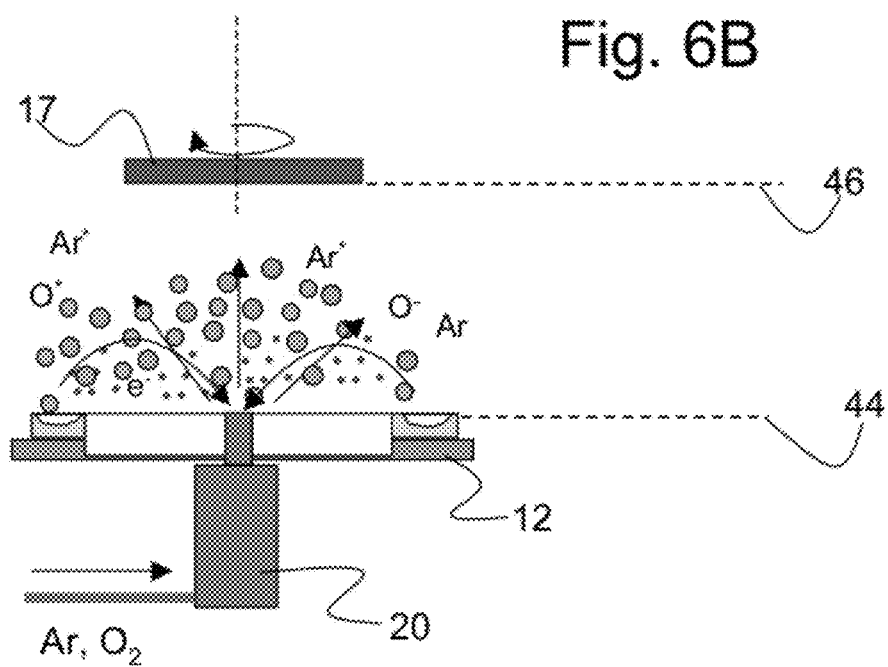

INTEGRATED ANODE AND ACTIVATED REACTIVE GAS SOURCE FOR USE IN MAGNETRON SPUTTERING DEVICE

CROSS-REFERENCE TO RELATED APPLICATIONS

This application claims priority from U.S. provisional application No. 61/472,494 filed Apr. 6, 2011; and this application is a continuation-in-part of U.S. application Ser. No. 13/087,301 filed Apr. 14, 2011, now U.S. Pat. 8,480,865, which claims priority from U.S. application No. 61/325,162 filed Apr. 16, 2010, which are incorporated herein by reference for all purposes.

FIELD OF THE INVENTION

This invention relates generally to a magnetron sputtering device for depositing materials onto substrates. More particularly the invention relates to an integrated anode and activated reactive gas source for use in a magnetron sputtering device and a magnetron sputtering device incorporating the same.

BACKGROUND OF THE INVENTION

Sputter coating is a widely used technique for depositing a thin film of material on a substrate. In a sputtering deposition process ions are usually created by collisions between gas atoms and electrons in a glow discharge. The ions are accelerated into the target of coating material at the cathode by an electric field causing atoms of the target material to be ejected from the target surface. A substrate is placed in a suitable location so that it intercepts a portion of the ejected atoms. Thus, a coating of target material is deposited on the surface of the substrate. In reactive sputtering a gaseous species is also present at the substrate surface and reacts with, and in some embodiments combines with, the atoms from the target surface to form the desired coating material.

In operation, when the sputter gas, e.g. argon, is admitted into a coating chamber, a DC voltage applied between the cathode and the anode ionizes the argon into a plasma, and the positively charged argon ions are attracted to the negatively charged cathode. The ions strike the target in front of the cathode with a substantial energy and cause target atoms or atomic clusters to be sputtered from the target. Some of the target particles strike and deposit on the wafer or substrate material to be coated, thereby forming a film.

To attain increased deposition rates and lower operating pressures, magnetically enhanced cathodes are used. In a planar magnetron, the cathode includes an array of permanent magnets arranged in a closed loop and mounted in a fixed position in relation to the flat target plate of coating material. Thus, the magnetic field causes the electrons to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability, thereby leading to a much higher sputtering rate than that obtained without the use of magnetic confinement. Furthermore, the sputtering process can be accomplished at a much lower gas pressure.

Typically a magnetron sputtering system is operated at a pressure of $2*10^{-2}$ Pa-$1*10^{-1}$ Pa. during sputtering. To establish this pressure, typically the chamber is pumped down to a pressure of $<1*10^{-4}$ Pa. and a controlled flow of a gas, typically Argon (and in case of reactive sputtering Argon and Oxygen or Nitrogen) is fed into the chamber to maintain the desired pressure. In the case of a diode system, i.e. when no magnets are used, a pressure of >2 Pa. is required to be able to ignite and sustain a plasma. High pressure has the disadvantage that the mean-free path is greatly reduced, which causes extensive gas scatter. This results in hazy coatings.

In the magnetron sputtering device the anode provides a charge differential to the negatively charged cathode. This can be provided as simply as an electric charge provided to the chamber walls. However, the sputtered material is also deposited on any surface exposed to the sputtered atoms. If the coating is an electrically insulating material, such as a metal oxide, the build up of the material on other parts of the sputtering apparatus can cause problems. In particular, the build up of an insulating coating on the anode interferes with the ability of the anode to remove electrons from the plasma, as required to maintain the plasma's charge balance. This destabilizes the plasma and interferes with deposition control. Coating build-up will cause the anode location to move to another surface in the system. This instability affects coating quality. Numerous prior art anodes have been proposed to overcome the problems of the anode becoming coated with the coating material. Many prior art anodes function at very high voltages that also increase the problems of arcing, which damages coating quality. A low voltage anode that can provide a stable anode location is desired for ensuring consistent coating quality.

An anode vessel is disclosed in US Publication No. 20060049041 filed Mar. 7, 2005 that can provide a stable anode location at low voltage. The anode comprises an interior surface of a vessel having a single opening in communication with the coating chamber. The interior surface of the vessel is the preferred return path for electrons. The anode vessel is also the source of sputter gas, which passes from an inlet port in the anode vessel through the single opening into the coating chamber. The size of the single opening and its location prevent coating material from building up on the charged interior surface of the anode.

Many optical coatings require the deposition of oxides or other compounds. Such materials are preferably produced in reactive sputter mode where a metallic target is sputtered and oxygen, nitrogen, or another reactive gas is added to the process. The sputtered material and the activated oxygen species arrive simultaneously at the substrate. The optimum flow, of oxygen for example, for the optimum oxygen partial pressure needs to be found. If the oxygen flow is too low, the films are not stoichiometric and have high absorption losses. If it is too high, the target surface becomes more oxidized than necessary preventing operation at the highest possible deposition rate. The sputter rate for a metallic target can be ten times higher than that of a fully oxidized target. The oxidation effectiveness can be increased if the oxygen is activated and directed at the substrates, thus increasing the possible deposition rate. The reactive sputter process is disclosed for oxides. All aspects can similarly be applied to nitrides or other reactive processes.

In order to produce dielectric coatings in a magnetron sputtering device with low or no optical absorption profile, it is necessary to provide an additional activated reactive gas source to provide Oxygen or Nitrogen to create a plasma. Examples of commercially available activated reactive gas sources include a PAS from JDSU, a Taurion source from ProVac, a KRI source from Kaufman & Robinson, an APS source from Leybold. Current activated reactive gas sources are complicated. Some require expensive electronics. Some require filaments that have limited lifetime. These devices are very expensive and can be maintenance intensive.

A Prior Art configuration of the anode vessel 19 and a separate reactive gas source 36 is illustrated in FIGS. 3A and 3B. The cathode 12 is positioned with its center at the central rotational axis C. An anode vessel 19 providing an ionized source of Argon gas is disposed on one side of the cathode 12 and the reactive gas source 36 of ionized Oxygen is disposed on an opposite side of the cathode 12. A substrate 17 rotates about the circumference of the cathode 12 over the reactive gas source 36. In the case of reactive sputtering with a standard cathode 12, a large variation of target wear has been observed which limits the target utilization. The target 14 can be seen in the cross section in FIG. 3B, on the side close to the reactive gas (oxidation) source 36, the target wear is low, due to an increase of target oxidation (poisoning); whereas on the side that is close to the anode 19, the target wear is high, due to an increase in plasma density.

A simpler, less expensive and more reliable source for activated reactive gas in a magnetron sputtering device is highly desirable.

It is also desired to increase the efficiency of oxidation of the deposited film in order to increase the deposition rate for reactive sputtering.

It is also desired to maintain a low temperature process despite increased power input in order to be able to process temperature sensitive materials.

SUMMARY OF THE INVENTION

The present invention has found that by integrating an anode vessel with a source for reactive gas, an activated reactive species can be provided in a magnetron sputtering device for applying dielectric coatings in a simpler, more efficient and cost effective device.

Accordingly, the present invention comprises a magnetron sputtering device for coating objects with coatings comprising:
a coating chamber adapted to be evacuated in operation;
a cathode including a target comprising material for forming a coating;
one or more coating areas having supports to support objects to be coated within a coating area; and
an integrated anode and activated reactive gas source, comprising a vessel including:
an interior conductive surface of the vessel, electrically coupled to a positive output of a power supply, comprising the anode for providing a voltage difference to the cathode such that the anode is the preferred return path for electrons,
an insulated outer surface of the vessel electrically isolated from the chamber walls;
a single opening to the vessel interior in communication with the coating chamber; a source for sputtering gas coupled into the vessel for providing sputtering gas through the single opening into the coating chamber; and
a source for reactive gas coupled into the vessel for providing reactive gas through the single opening into the coating chamber.

An embodiment of the invention is further defined wherein the insulated outer surface of the vessel is disposed exterior to the coating chamber.

An embodiment of the invention is further defined wherein a distance from a surface plane of the objects to be coated to a plane containing the single opening of the vessel is equal to or greater than a distance from the surface plane of the objects to be coated to a surface plane of the target.

An embodiment of the invention is further defined wherein a further reactive gas source is provided to augment the integrated anode and activated reactive gas source.

An embodiment of the invention comprises an integrated anode and activated reactive gas source, comprising a vessel including:
an interior conductive surface of the vessel, electrically coupled to a positive output of a power supply, comprising the anode for providing a voltage difference to the cathode such that the anode is the preferred return path for electrons,
an insulated outer surface of the vessel electrically isolated from the chamber walls;
a single opening in communication with the coating chamber;
a source for sputtering gas coupled into the vessel for providing sputtering gas through the single opening into the coating chamber; and
a source for reactive gas coupled into the vessel for providing reactive gas through the single opening into the coating chamber.

An embodiment of the invention is further defined wherein the sputtering gas and reactive gas are provided through a single inlet port into the vessel.

An embodiment of the invention is further defined wherein the sputtering gas and reactive gas are provided through separate inlet ports into the vessel.

BRIEF DESCRIPTION OF THE DRAWINGS

Exemplary embodiments of the invention will now be described in accordance with the drawings, in which:

FIG. 4A is a schematic top view of a coating geometry in accordance with the present invention including an integrated anode and activated reactive gas source;

FIG. 4B is a schematic cross-section of the coating geometry of FIG. 4A;

FIG. 6A is a schematic top view of a coating geometry in accordance with the present invention in which the integrated anode and activated reactive gas source is disposed at the center of a ring shaped cathode;

FIG. 6B is a schematic cross-section of the coating geometry of FIG. 6A;

DETAILED DESCRIPTION

We observed that the anode vessel disclosed in US Publication No. 20060049041 filed Mar. 7, 2005 in its typical arrangement contains a plasma. The plasma is ignited by the high density of electrons coming from the cathode and returning to the power supply through the anode. The effect of ion creation and the creation of activated species is similar to the reactions occurring at the cathode: energetic e−+Ar=>2e−+Ar+or energetic e−+Ar=>e−+Ar*. There would not be visible plasma at the anode without this activation of the argon atoms. We decided to test adding oxygen to the anode to test if it would generate activated and ionized oxygen. By coupling the oxygen feed into the anode vessel, we were able to deposit a clear $SiO_2$ single layer. This is a clear indication that the anode operating with argon and oxygen is behaving as an anode and an activated reactive gas source. Additionally, we did not observe oxidation of the inside walls of the anode.

Figure 1:
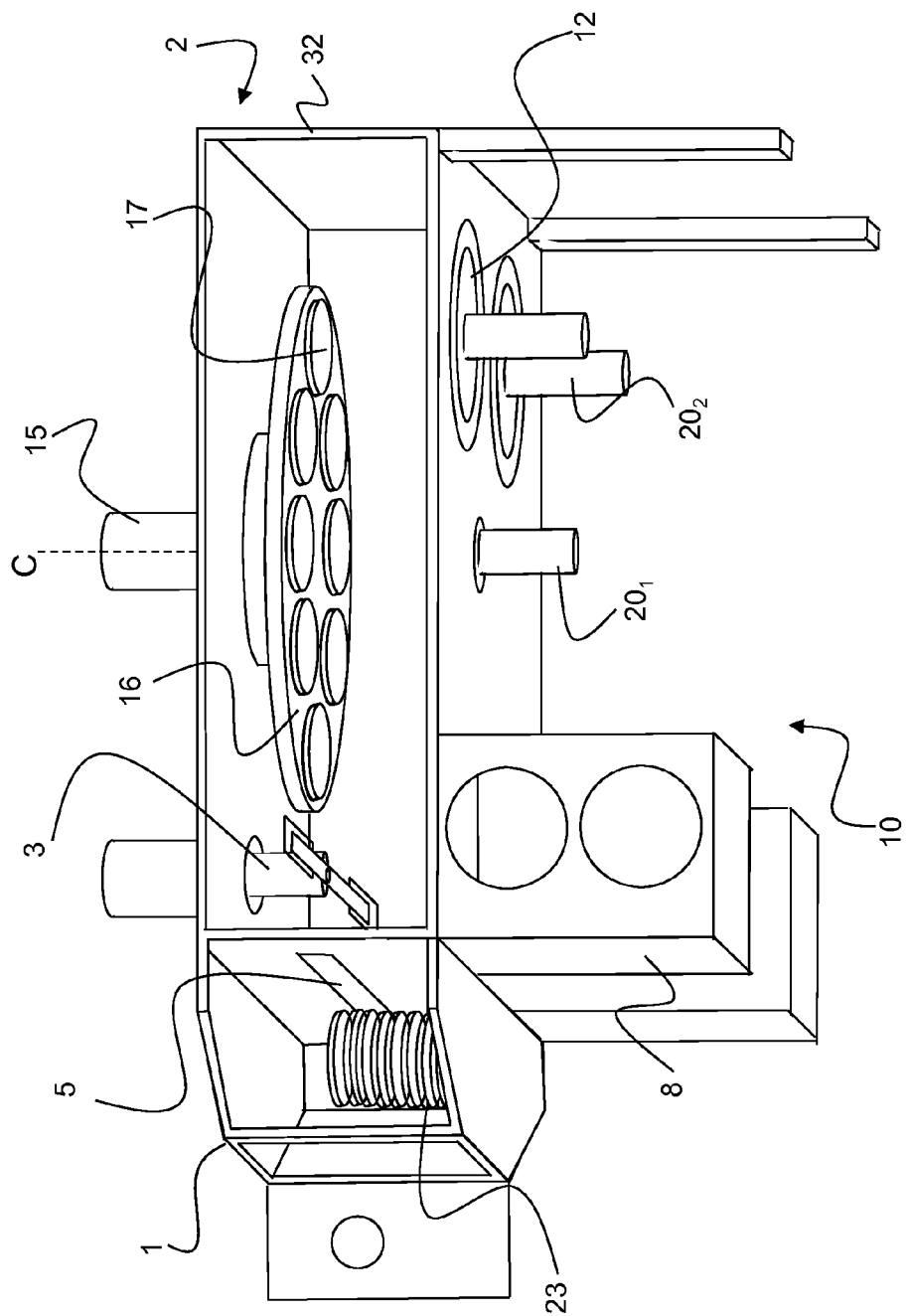
FIG. 1 is an isometric view of the coating system of the present invention with some outer wall removed.
Figure 2:
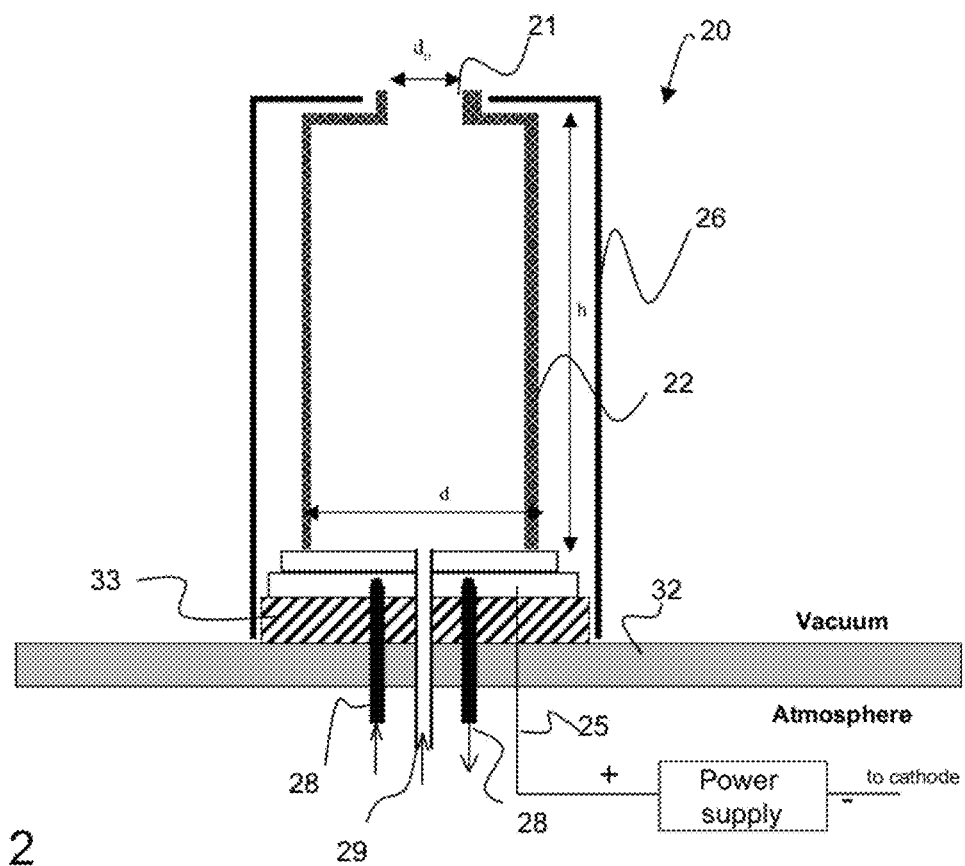
FIG. 2 is a cross-section of an anode vessel for use in the magnetron sputtering device.
Figure 7A:
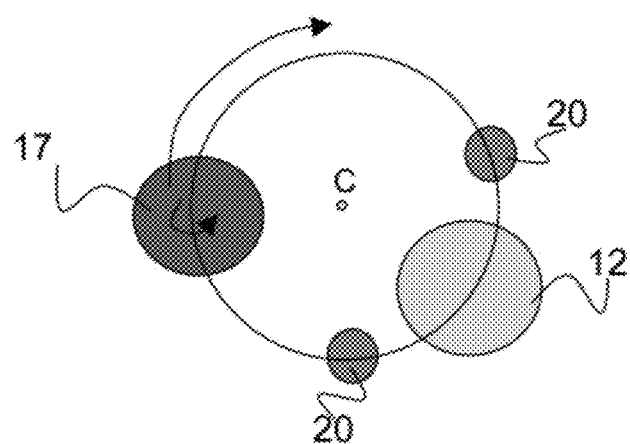
FIG. 7A is a schematic top view of a coating geometry in accordance with the present invention in which two integrated anode and activated reactive gas sources are incorporated; and, FIG. 7B is a schematic cross-section of the coating geometry of FIG. 7A.

An isometric view of the coating chamber 2 of a magnetron sputter coating device 10 is shown in FIG. 1. Pumps 8 evacuate the coating chamber 2 for operation under vacuum conditions, understood to mean where the pressure is below atmospheric pressure. The chamber walls 32 are grounded and isolated from the positively charged anode 20 and the negatively charged cathode 12. A planetary drive 15 comprises a carrier 16 or rack rotatable about a central rotational axis C, with a plurality of e.g., seven or eight, planets 17 supported radially about the central rotational axis C. A ring shaped cathode 12, in this embodiment two cathodes 12, are shown. Items $20_1$ and $20_2$ each comprise an integrated anode and activated reactive gas source with an opening in communication with the coating chamber 2. Reference numerals $20_1$ and $20_2$ distinguish different positions of the integrated anode and activated reactive gas source 20 (FIG. 2). An additional integrated anode and activated reactive gas source $20_2$ is shown at the center of cathode 12. These positions can be alternative positions, depending on whether a ring cathode or a solid cathode is used, or both can be used as shown. Even in the absence of a ring cathode, two integrated anode and activated reactive gas sources 20 can be positioned on opposite sides of a cathode, as shown in FIGS. 7A and B, to enable a higher deposition rate. The integrated anode and activated reactive gas source 20 (see FIG. 2) includes one or more inlet ports 29 to supply sputter gas and reactive gas to the coating chamber 2. The magnetron sputter coating device 10 includes a load lock 1 for loading and unloading substrates or other objects 23, for coating. This allows the coating chamber 2 to remain under vacuum conditions at all times.

The integrated anode and activated reactive source can be implemented in a pulsed DC magnetron sputtering, DC magnetron, AC magnetron sputtering and rf magnetron sputtering.

The integrated anode and activated reactive gas source 20 provides a charge differential to the negatively charged cathode. Referring now to FIG. 2 an integrated anode and activated reactive gas source 20 is shown in the form of a container or vessel having inner conductive surface of copper or stainless steel 22 comprising the anode and having a single opening 21 at a first end for communicating with a coating chamber 2 to which it is directly coupled. The opening 21 can be located on a side or end of the vessel. Conveniently, the opening 21 can be positioned in the chamber walls 32 with the vessel itself outside the chamber 2. This achieves space efficiency in the chamber and assists service access. The opening 21 is positioned adjacent the cathode 12 approximately positioning the plume of sputtered material from the target and the plume of activated and ionized oxygen to overlap as closely as possible to simultaneously arrive at the substrate to be coated. The outer surface 26 of the vessel is electrically insulated. In the cross sectional view water cooling pipes 28 are shown substantially around the anode 20 for maintaining the temperature of the anode in operation. A gas inlet port 29 is shown for providing a conduit into which sputter gas and reactive gas, Oxygen or Nitrogen, may enter the vessel. The gasses are mixed prior to the inlet port 29, or alternately two separate inlet ports 29 can be coupled into the vessel. The flow of reactive gas can be shut off when the coating device 10 is not creating dielectric coatings, so that only sputter gas flows through the vessel. The size of the opening 21 is relatively small and the flow of gases can be selected to locally pressurize the vessel. The relatively small opening 21, having a circumference significantly smaller than the circumference of the vessel, and the location of the opening 21 out of a line of sight to the target prevent coating material from entering and coating the inner conductive surface 22 of the anode. In operation the vessel is pressurized above the chamber pressure with the flow of argon gas and a reactive gas that together promote the formation of plasma in the coating chamber 2. A plasma is ignited by the high density of electrons coming from the cathode and returning to the power supply through the anode, and is sustained by a maintenance voltage thereafter. The argon plasma has proven to be sufficient to ignite the reactive gas simultaneously. Pressure within the vessel, higher than the rest of the coating chamber 2, allows for a lower anode voltage that promotes a more stable sputtering condition. Positive power supply lead 25 connects the power supply to the inner conductive surface 22 of the anode. The integrated anode and activated reactive gas source device 20 shown in FIG. 2 was designed to function with a low anode voltage and little or no arcing. A low anode voltage of approximately +15 to +80 volts is preferred to reduce process variation. The anode inner conductive surface 22 are electrically insulated from the grounded chamber walls 32 by an insulating material 33.

In a preferred embodiment the integrated anode and activated reactive gas source comprises a vessel of cylindrical shape with a diameter of at least d=10 cm and a length of at least h=20 cm with an opening (21) to the coating chamber (2) at one end as shown in FIG. 2 and closed at the opposite end. For low scattering processes the chamber pressure is below 0.267 Pa (2) mTorr). A higher pressure at the anode is achieved by the smaller opening 21 of the anode 20 and a controlled flow of process gas and reactive gas into the vessel via the inlet port 29. An optimum opening has an area of about 20 cm$^2$ and is preferably round. In operation the vessel can be pressurized to more than 0.400 Pa (3) mTorr).

Figure 3A:
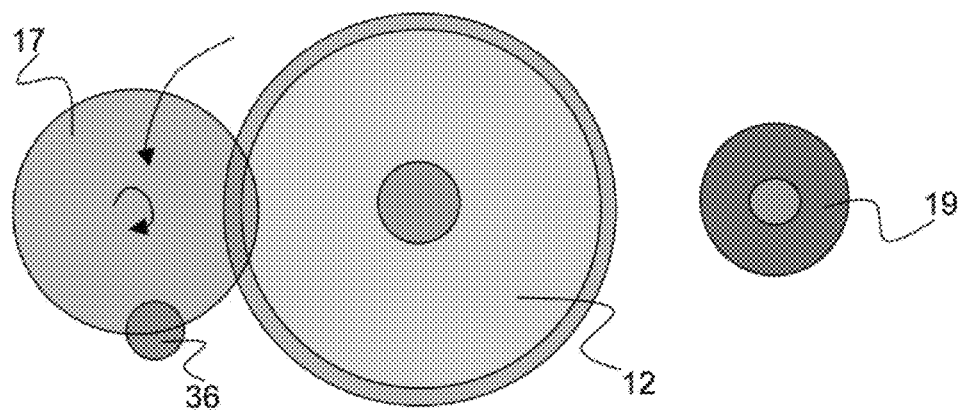
FIG. 3A is a schematic top view of a Prior Art separate anode vessel and activated reactive gas source.
Figure 3B:
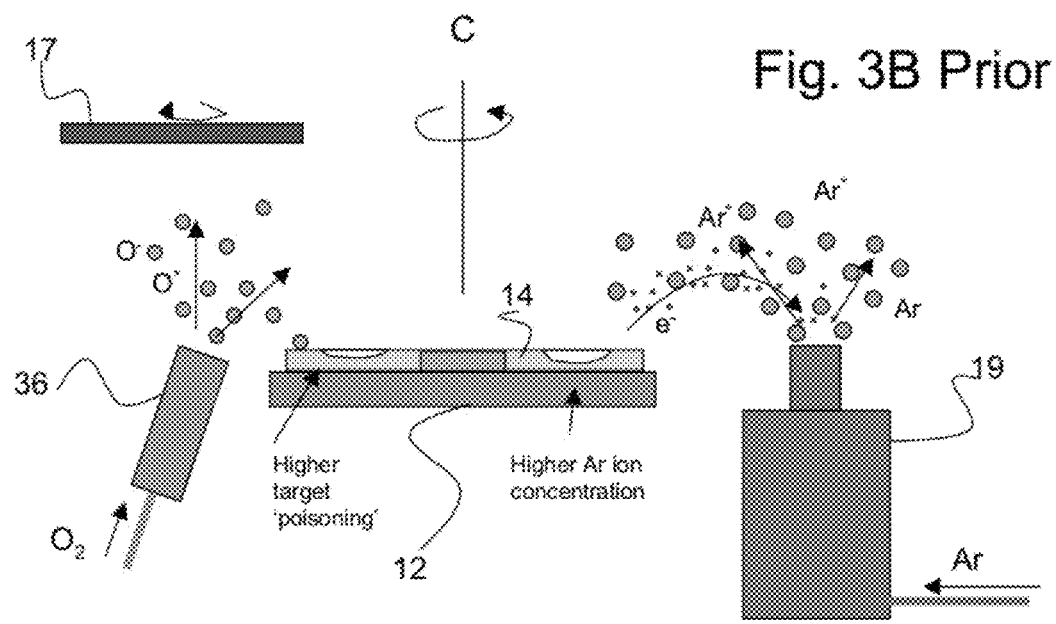
FIG. 3B is a schematic cross-section of the Prior Art separate anode vessel and activated reactive gas source.

In one configuration of a magnetron sputtering device incorporating an integrated anode and activated reactive gas source, shown in FIGS. 4A and 4B, a cathode 12 is disposed with its center at the central axis C. The integrated anode and activated reactive gas source 20 is located adjacent the cathode 12. At least one substrate 17 mounted to a coating area is rotated about an orbit of the central axis C at a radial distance substantially equal to the distance of the integrated anode and activated reactive gas source 20 from the central axis C, so that the at least one substrate 17 passes over the opening 21 of the integrated anode and activated reactive gas source. One would expect a lower gradient of target wear in this configuration than in FIG. 3A,B, because higher plasma density (high Ar ion concentration) and poisoning of the target are at the same location.

Figure 5A:
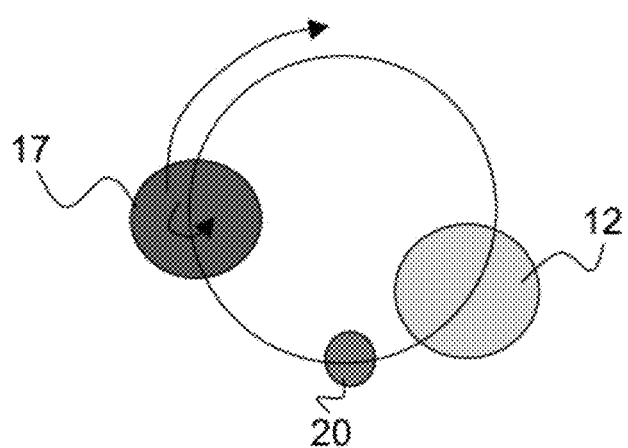
FIG. 5A is a schematic top view of an alternative coating geometry in accordance with the present invention, in which the substrates to be coated pass over the cathode.
Figure 5B:
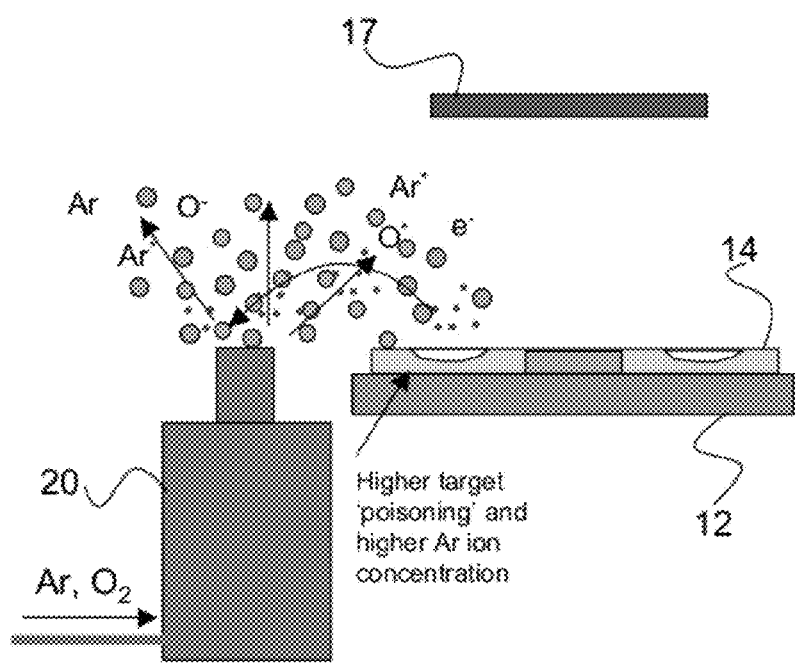
FIG. 5B is a schematic cross-section of the coating geometry of FIG. 5A.

In another configuration of a magnetron sputtering device incorporating an integrated anode and activated reactive gas source, shown in FIGS. 5A and 5B the cathode 12 is translated a radial distance from the central axis C. One or more substrates 17 are rotated in an orbit having a radius equal to the radial distance the cathode 12 is translated. The integrated anode and activated reactive gas source 20 is also located a same radial distance from the center adjacent the cathode 12, so that the one or more substrates 17 pass over the cathode 12 and integrated anode and activated reactive gas source 20 in quick succession.

An integrated anode and activated reactive gas source 20 can be located with its opening 21 at the center of the ring cathode in a magnetron sputtering device, as shown in FIG. 1 and FIG. 6, since the opening 21 is relatively far away from strong magnetic fields. This improves the symmetry of the system, which is expected to cause a uniform wear pattern of the target, which improves target utilization.

In a preferred embodiment shown in FIGS. 6A and 6B, by including the oxygen source in the anode vessel together as an integrated anode and activated reactive gas source 20 in the center of the cathode 12, a very symmetric system is created and target wear is expected to be uniform. An auxiliary activated reactive source located a distance from the cathode 12 (e.g. at $20_1$ as shown in FIG. 1) can be provided in addition to enable a higher deposition rate. Experiments have shown that higher deposition rates of metal oxides with low absorption can be achieved when the plume of sputtered material from the target and the plume of activated and ionized oxygen overlap and simultaneously arrive at the substrate to be coated. Thus, having the integrated anode and activated reactive gas source 20 in the center of the target is an almost ideal solution. The source output can be ionized, or otherwise activated oxygen species (e.g. atomic oxygen, ozone). The opening 21 of the integrated anode and activated reactive gas source 20 is positioned just at a target surface plane 44 in the center of the cathode 12. Substrates 17 are supported for rotation over the concentric cathode 12 and integrated anode and activated reactive gas source 20. A distance from a surface plane 46 of the objects to be coated to a plane containing the single opening 21 of the vessel is equal to or greater than a distance from the surface plane of the objects to be coated to a surface plane of the target.

Figure 7B:
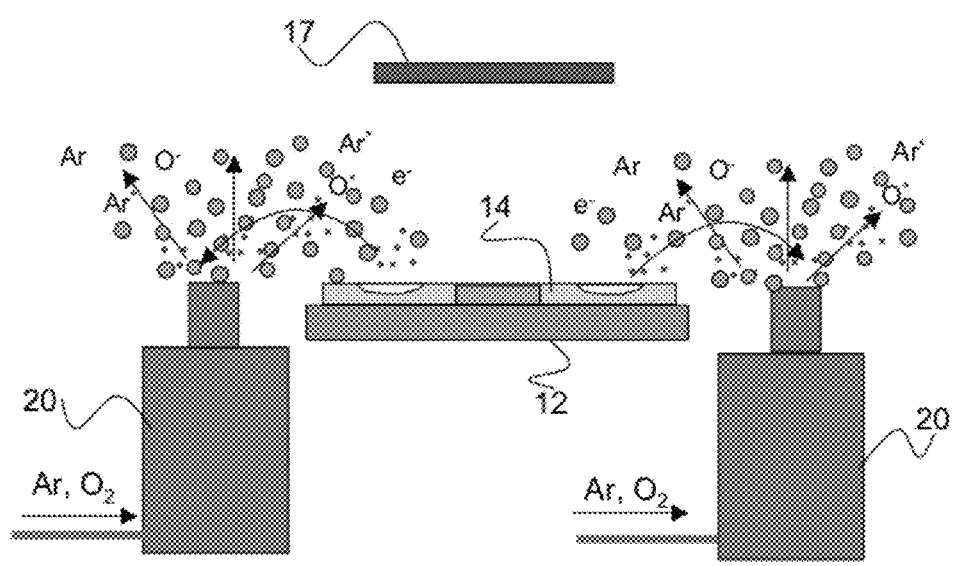

A further example configuration of a magnetron sputtering device incorporating and integrated anode and activated reactive gas source is shown in FIGS. 7A and 7B in which two integrated anode and activated reactive gas sources 20 are disposed on opposite sides of a cathode 12, each source 20 and the cathode located at a same radial distance from a central rotation axis C. A support for one or more substrates to be coated, is adapted to support the substrates in a rotation about the central rotation axis C the same radial distance so as to pass the substrates above the cathode and integrated anode and activated reactive gas sources. The two integrated anode and activated reactive gas sources 20 can be used both continuously, or cycled alternately between them at a frequency of 1 Hz or greater.

Numerous other configurations for use in different magnetron platforms, such as in-line or with rectangular or cylindrical cathodes are also feasible.

What is claimed is:

1. A magnetron sputtering device comprising:
   a coating chamber adapted to be evacuated in operation;
   a cathode having a central axis on which is disposed a target comprising material for forming a coating on one or more substrates;
   a carrier comprising a plurality of coating areas and disposed above the target; and
   one or more integrated anode and activated reactive gas sources located adjacent to the cathode, wherein each integrated anode and activated reactive gas source comprises:
   a vessel including:
      a conductive interior surface having one or more sidewalls and an adjoining end wall defining an interior of the vessel, electrically coupled to a positive output of a power supply, thereby serving as an anode and a preferred return path for electrons,
      an insulated outer surface for electrically isolating the vessel from chamber walls of the coating chamber;
      an opening configured to permit gas to pass from the interior of the vessel to the coating chamber; and
      one or more gas inlet ports that are configured to direct a sputtering gas and a reactive gas to the interior of the vessel such that the reactive gas becomes activated forming a plasma in the interior of the vessel;
   wherein a center point of the carrier and the opening of the integrated anode and activated reactive gas sources are disposed a same radial distance from the central axis of the cathode.

2. The magnetron sputtering device of claim 1, wherein a circumference of the opening is smaller than a circumference of the interior of the vessel to shield the conductive interior surface from sputtered material.

3. The magnetron sputtering device of claim 1, wherein the opening of the vessel is dimensioned such that a flow of sputtering gas and reactive gas can be selected to raise the pressure of the mixture of sputtering gas and reactive gas within the vessel higher than the pressure of the gases in the coating chamber.

4. The magnetron sputtering device of claim 1, wherein in operation a voltage of 15 to 80 Volts is provided to the conductive interior surface of the vessel.

5. The magnetron sputtering device of claim 1, wherein the sputtering gas is argon and the reactive gas is oxygen or nitrogen.

6. The magnetron sputtering device of claim 1, wherein the insulated outer surface of the vessel is disposed exterior to the coating chamber.

7. The magnetron sputtering device of claim 1, having a first and a second integrated anode and activated reactive gas sources.

8. The magnetron sputtering device of claim 1, wherein the center point of the carrier rotate about the central axis, and wherein in operation the carrier passes directly above the opening of the integrated anode and activated reactive gas source.

9. The magnetron sputtering device of claim 1, wherein the integrated anode and activated reactive gas source comprises one gas inlet port, and wherein the sputtering gas and the reactive gas flow through the gas inlet port into the vessel.

10. A magnetron sputtering device comprising:
   a coating chamber having a central rotation axis and adapted to be evacuated in operation;
   a cathode on which is disposed a target comprising material for forming a coating on one or more substrates;
   a carrier comprising a plurality of coating areas and disposed above the target; and
   two integrated anode and activated reactive gas sources disposed on opposite sides of the cathode, wherein each integrated anode and activated reactive gas source comprises:

a vessel including:
a conductive interior surface having one or more sidewalls and an adjoining end wall defining an interior of the vessel, electrically coupled to a positive output of a power supply, thereby serving as an anode and a preferred return path for electrons,
an insulated outer surface for electrically isolating the vessel from chamber walls of the coating chamber;
an opening configured to permit gas to pass from the interior of the vessel to the coating chamber; and
one or more gas inlet ports that are configured to direct a sputtering gas and a reactive gas to the interior of the vessel such that the reactive gas becomes activated forming a plasma in the interior of the vessel;
wherein the cathode, the opening of each of the integrated anode and activated reactive gas sources, and the carrier are disposed a same radial distance from the central rotational axis of the chamber.

11. The magnetron sputtering device of claim 10, wherein in operation the carrier passes directly over the cathode and the two integrated anode and activated reactive gas source.

12. The magnetron sputtering device of claim 10, wherein the two integrated anode and activated reactive gas sources each operate continuously.

13. The magnetron sputtering device of claim 10, wherein the two integrated anode and activated reactive gas sources operate in alternation at a frequency of 1 Hz or greater.

* * * * *